(12) United States Patent
Bury et al.

(10) Patent No.: US 10,825,633 B2
(45) Date of Patent: Nov. 3, 2020

(54) CIRCUIT BOARD ARRANGEMENT HAVING ELECTRICAL LEADS FOR HOLDING AN ELECTRICAL FUSE

(71) Applicant: Phoenix Contact GmbH & Co. KG, Blomberg (DE)

(72) Inventors: Joachim Bury, Herford (DE); Thomas Salomon, Verl (DE); Hennig Stoffels-Korndorf, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 16/491,284

(22) PCT Filed: Mar. 5, 2018

(86) PCT No.: PCT/EP2018/055286
§ 371 (c)(1),
(2) Date: Sep. 5, 2019

(87) PCT Pub. No.: WO2018/162379
PCT Pub. Date: Sep. 13, 2018

(65) Prior Publication Data
US 2020/0027681 A1    Jan. 23, 2020

(30) Foreign Application Priority Data
Mar. 7, 2017   (DE) .................... 10 2017 104 685

(51) Int. Cl.
*H01H 85/22*   (2006.01)
*H01H 85/20*   (2006.01)
*H05K 1/18*    (2006.01)

(52) U.S. Cl.
CPC .... *H01H 85/2015* (2013.01); *H01H 85/2045* (2013.01); *H01H 85/22* (2013.01);
(Continued)

(58) Field of Classification Search
CPC .......... H01H 85/2015; H01H 85/2045; H01H 85/22; H01H 2085/2075; H01H 2085/208;
(Continued)

(56) References Cited

U.S. PATENT DOCUMENTS 4,555,638 A    11/1985  Lobe
5,928,004 A *  7/1999   Sumida ............... B60R 16/0238
                                                439/76.2
(Continued)

FOREIGN PATENT DOCUMENTS

DE        3022115 A   12/1981
DE       69525126 T2   5/2002
(Continued)

*Primary Examiner* — Jacob R Crum
(74) *Attorney, Agent, or Firm* — Holland & Hart LLP

(57) ABSTRACT

The invention relates to a circuit board arrangement for electrical separation of leads, comprising a fuse board configured to hold an electrical fuse, wherein the fuse board has electrical leads and openings formed between adjacent electrical leads; and comprising an insulating member configured to receive the fuse board, wherein the insulating member has separators, wherein the separators are configured to insert into the openings and electrically separate the leads.

17 Claims, 10 Drawing Sheets

(52) U.S. Cl.
CPC ......... *H05K 1/18* (2013.01); *H01H 2085/208* (2013.01); *H01H 2085/2085* (2013.01); *H05K 2201/10181* (2013.01)

(58) Field of Classification Search
CPC ............. H01H 2085/2085; H05K 1/18; H05K 2201/10181
See application file for complete search history.

(56) References Cited

U.S. PATENT DOCUMENTS

| | | | |
|---|---|---|---|
| 6,162,990 | A | 12/2000 | Sakamoto |
| 2001/0034144 | A1* | 10/2001 | Chemin .............. B60R 16/0239 439/76.2 |
| 2003/0082937 | A1* | 5/2003 | Burdick ............... H01R 9/2466 439/76.2 |
| 2004/0214473 | A1* | 10/2004 | Maebashi .......... H01H 85/2045 439/620.27 |
| 2008/0268671 | A1* | 10/2008 | Harris .................... H01H 85/34 439/76.2 |
| 2015/0009640 | A1* | 1/2015 | Stern ................. H01R 13/6658 361/752 |

FOREIGN PATENT DOCUMENTS

| | | |
|---|---|---|
| DE | 102004041207 A1 | 3/2006 |
| WO | WO 2004002202 A1 | 12/2003 |

\* cited by examiner

CIRCUIT BOARD ARRANGEMENT HAVING ELECTRICAL LEADS FOR HOLDING AN ELECTRICAL FUSE

CROSS-REFERENCES

The present application is a national phase entry under 35 U.S.C. § 371 of PCT Application No. PCT/EP2018/055286, filed 5 Mar. 2018, and entitled "CIRCUIT BOARD ARRANGEMENT HAVING ELECTRICAL LEADS FOR HOLDING AN ELECTRICAL FUSE." PCT Application No. PCT/EP2018/055286 claims the benefit of German Patent Application No. 10 2017 104 685.2, filed 7 Mar. 2017, and entitled "Platinenanordnung für elektrische Leitungen." Each of these applications is incorporated by reference herein for all purposes.

BACKGROUND

The present disclosure relates to a circuit board arrangement having electrical leads and at least one electrical fuse.

Current-carrying electrical leads are typically spaced apart from one another, for example by an air gap or an insulator section, in order to electrically extend electrical leakage current distances.

One disadvantage of this, however, is the need for long isolating distances at higher electrical outputs, which leads to an enlargement of component volume. This is particularly disadvantageous in network topologies having electrical leads without a central node, because the cost of shielding distributed electrical circuits against external influences increases as the volume of the electrical circuits increases.

SUMMARY

It is therefore the object of the present disclosure to provide a more efficient lead arrangement to achieve smaller component volume.

This object is achieved with the features of the independent claim. Advantageous examples are the subject matter of the dependent claims, the description and the accompanying figures.

The present disclosure is based on the realization that the above object may be achieved with a lead arrangement in the form of a circuit board arrangement, which comprises separators that may be inserted into openings for the three-dimensional extension of the electrical leakage distances. The leads may extend in different planes and may be nested, as a result of which the packing density of the electrical leads, and, if applicable, of electrical components arranged on the circuit board, may be increased. It is thus possible to advantageously reduce the installation volume of the lead arrangement.

According to a first aspect, this disclosure relates to a circuit board arrangement for the electrical separation of leads having a fuse board for holding an electrical fuse, wherein the fuse board comprises electrical leads and openings formed between adjacent electrical leads, and having an insulating member which is configured to receive the fuse board, wherein the insulating member comprises separators, and wherein the separators are insertable into the openings and separate the electrical leads electrically.

An advantageous reduction of the space needed for the installation of the fuse circuit may typically only take place the normative requirements are maintained, in particular the necessary air gaps and leakage distances. The relevant electrical distance between two electrical leads is determined, on the one hand, through the geometric distance between the electrical leads and, on the other hand, through the medium or the structure between the electrical leads. The latter is used in a three-dimensional, plane-based and nested arrangement, as is the basis for the disclosure, in order to advantageously produce large electrical distances between the electrical leads at small geometric distances.

Since air generally has higher dielectric strength than a circuit board, the openings between the electrical leads increase the electrical distance between the electrical leads of the fuse board. The electrical distance between the electrical leads is additionally increased by the separators inserted into the openings, because the air gap between the conductors now extends around the separator. This insulation structure makes it possible to have a smaller geometric distance between the electrical leads or electrical components on the fuse board, and thus advantageously reduce the installation space for the circuit board arrangement.

Electrical leads on the fuse board may be folded over at a distance from one another to form a three-dimensional electrical lead structure. An advantageous arrangement of the electrical leads, in particular with respect to the length of the electrical leads and the necessary isolating distances between the electrical leads, may thus be achieved. This allows the surface area of the fuse board to be reduced, so that the total surface area of the circuit board arrangement may be advantageously reduced.

In one example, the fuse board may be inserted into the insulating member, or the insulating member may be placed onto the fuse board, so that the insulating member at least partially surrounds the fuse board laterally.

Because the insulating member planarly surrounds the fuse board, the fuse board may be electrically insulated, in particular on the sides of the fuse board and on the side of the fuse board facing toward the insulating member. The insulating member may additionally form a plurality of form-fit connections with the fuse board to improve the tight fit of the fuse board in the insulating member.

The insulating member and the fuse board may be formed in one piece. Furthermore, the insulating member may be made of a plastic, in particular an electrically insulating polymer, and may, for example, be formed by injection moulding.

In one example, the separators pass through the openings in the fuse board and protrude from the side of the fuse board facing away from the insulating member in order to electrically insulate the electrical leads from one another on the side of the fuse board facing away from the insulating member.

The openings can delimit the separators laterally and, taking into account mechanical tolerances, may be arranged as close to one another as possible. The fuse board is thus already connected to the insulating member without being fastened via screw or snap-in connections, and is, in particular, aligned in a specific position with respect to the insulating member. The electrical insulation of the electrical leads may be increased if the separators inserted into the openings are at a distance from the inner wall of the openings and when there is, in particular, no connection between the separators and the fuse board. The air gap thus formed between the separators and the fuse board causes an increase in the electrical insulation of the electrical leads. This therefore has the advantage that the distance between the leads may be reduced without changing the insulation of the leads and a more compact lead arrangement may be obtained.

In one example, the separators have a straight shape or are composed of straight sections which are arranged at angles to one another.

The alignment and shape of the separators or the openings follows the alignment of the leads to achieve a uniform electrical insulation of the electrical leads.

In one example, the fuse board comprises a plurality of plug contacts, wherein the insulating member encloses the plug contacts circumferentially.

The plug contacts may be configured to connect external leads to the fuse board. The encasement of the plug contacts by the insulating member allows high packing density of the plug contacts, because electrical insulation of the plug contacts may be accomplished in a small space. The encasement of the plug contacts by the insulating member may, for example, be configured for form-locking connection to a plug socket.

In one example, a fuse receptacle, in particular a spring holder, is arranged on the fuse board to hold the fuse.

A fuse receptacle for holding a fuse is typically soldered or clamped to the fuse board. The fuse receptacle may, in particular, be configured to hold a type 10×38 fuse or a type 6.4×32 fuse. A replacement fuse may be provided for each of the fuses in the example or the type 6.4×32 fuse. This makes possible an advantageous redundancy of the protection of electrical leads against overcurrent.

The fuse receptacle may form a friction-locked and electrically conductive connection with the fuse, for example via a clamp connection at the end contacts of the fuse. The clamp connection may be configured in such a way that the connection between the fuse and the fuse receptacle is released non-destructively. This is, in particular, necessary for the replacement of an activated fuse by a new fuse. The replacement of the fuse may be carried out without an additional tool, as a result of which maintenance costs and the time required for maintenance or repair is advantageously reduced.

In addition to the releasable plug or clamp connection of the fuse on the fuse board, a material bond connection of the fuse to the fuse board is also possible, for example by soldering the fuse onto the fuse board. This type of connection has the advantage of a lower probability of failure as a result of vibrations acting on the connection, the entry of foreign bodies or humidity resulting from condensation. The fuse may be replaced by unsoldering the fuse and soldering on a new fuse.

In one example, the separators electrically insulate the plug contacts and the fuse receptacle from one another.

The plug contacts and fuse receptacles form electrical leads, which are arranged on the fuse board and project from the fuse board. The insulating member comprises openings, so that the fuse receptacles and the plug contacts continue to be accessible after insertion of the fuse board into the insulating member. The electrical insulation of the fuse receptacle and the plug contacts creates a small distance between the fuse receptacle and the plug contacts e, so that the required installation space and the area on the fuse board for the fuse receptacle and the plug contacts may be advantageously reduced.

In one example, the plug contacts and the fuse receptacle are arranged on a side of the fuse board facing toward the insulating member and are laterally delimited by the insulating member.

The insulating member may completely enclose the plug contacts circumferentially, so that the plug contacts are protected against contact. This may be enhanced with collar-shaped projections of the insulating member at the tips of the plug contacts that extend beyond the height of the plug contacts, so that objects with a larger diameter than the plug contacts cannot make an electrical connection with the plug contacts. Said objects may be fingers or tools, for example, that come into contact with the circuit board arrangement during maintenance.

In one example, receiving sleeves for screw connections are laterally arranged in the insulating member, while notches f are formed in the fuse board for the screw connections, wherein the circuit board arrangement with the insulating member and the fuse receptacle may be mounted to face outward in an housing upper part, in particular by using the screw connections.

In one example, the fuse and an additional fuse are arranged in the fuse receptacle on the fuse board, wherein the insulating member laterally encloses and electrically insulates the fuse and the additional fuse.

This arrangement of the fuses allows easy access to the individual fuses, so that the fuses may be removed from the fuse receptacle, for example by means of a simple mechanical movement, while new fuses may be inserted into the fuse holder with a similar simple mechanical movement. The replacement of a fuse may be further simplified by the use of a fuse holder, which circumferentially encloses the fuse.

This simplification of the insertion or removal of the fuse from the fuse board is advantageous for automatic fitting of the fuse board using an automatic fitting tool, for example a feeder, because said automatic fitting tool may take into account mechanical tolerances and minimum distances. The arrangement of the fuses with distances and shapes that are favourable for feeder fitting allows the production of the circuit board arrangement to be carried out automatically or semi-automatically. The replacement of the fuse may also be carried out automatically by means of a tool, for example after opening the housing surrounding the circuit board arrangement.

In one example, the fuse passes through an opening in the insulating member.

This allows access to the fuse even when the fuse board is inserted into the insulating member.

In one example, the circuit board arrangement comprises a control board and a plug connector, wherein the plug connector is configured to mechanically and electrically connect the fuse board to the control board.

The control board may provide failure monitoring for an electrical circuit implemented on the fuse board and/or on the control board, and also supply information about the status, in particular information about a malfunction, of said electrical circuit. It is thus possible to ensure that a failure of the electrical circuit may be detected without external actions and that information, for example about a problem or proper operation, is available during operation.

An electrical circuit arranged on the fuse board and or on the control board may, for example, be a device to protect against electrical currents that exceed the electric current flow capacity of the electrical leads on the circuit boards. In an industrial environment, such electrical circuits are protected, for example, against external influences by means of housings. In star-shaped network topologies, the protection of the electrical leads may take place, for example, in a central switch box which protects a plurality of electrical circuits from external influences in accordance with a protection class.

In network topologies without a central node, the overcurrent protection fuse of each electrical lead has to be separately protected from external influences. Conventional overcurrent protection fuses require a large installation space, which results in a greater space requirement and higher costs for protection against external influences. The present disclosure may be used to reduce the space requirement of an overcurrent protection fuse and thus advantageously reduce the complexity of the housing as well as the production costs.

The information regarding the operational status of the electrical circuit arranged on the circuit board may be provided by the control board via an interface of an external sink in the form of a digital or analogue electrical signal. The operational status of the electrical circuit may also be indicated directly by the control board via indicators, for example light-emitting diodes or displays.

The function of the failure monitoring of the control board may be further extended by an interface for an automation application, so that information about the operational status of the electrical circuit, but, in particular, of a plurality of separate electrical circuits, may be processed automatically. The operational status of an electrical supply network comprising a separate electrical circuit, in particular an overcurrent protection circuit, in each lead section may thus be determined centrally and/or automatically and continuously monitored.

A signal line between the control board and the external sink may be in the form of a fibre optic cable (FOC).

In one example, the circuit board arrangement comprises a cover plate, wherein a plurality of snap-in connectors for receiving the cover plate are formed in the insulating member, while the cover plate is arranged on a side of the fuse board facing away from the insulating member.

The normative requirements, in particular for air gaps and leakage distances between the electrical leads, also have to be implemented between the control board and the fuse board. The cover plate has a space between the fuse board and the control board, wherein the space may be filled with the material of the cover plate, which may be, in particular, an insulating plastic, or air. In one example having an air gap, the cover plate provides a scaffold-like structure for connecting the control board and the fuse board, wherein the friction fit of the connection may be achieved using click connections or form-locking plug connections or screw connections.

In one example, the housing upper part, the control board, the cover plate, the fuse board and the insulating member may be stacked, in particular stacked one inside the other, in the aforementioned order, and connected.

The nested stacking of the functional components, in particular the control board, the fuse board, the cover plate and the insulating member, makes it possible to obtain an easy-to-assemble structure. It is furthermore possible to produce other functional components in a stackable design, so that a system consisting of functional components that are stackable with one another and may, in particular, be stacked one inside the other or one above the other, is created. An arrangement, for example with higher logic functions, may thus be assembled from a system of standardised functional components similarly to a construction kit.

A stack of functional components may be, in particular, produced in a form-locking manner with interlocking profiles of the functional components, so that, in addition to the electrical contacts between the functional components, a fixed mechanical connection between the functional components is also formed.

In one example, the cover plate comprises openings for receiving the plug connector.

The implementation of the connection between the fuse board and the control board with plug connectors and plug sockets makes it possible to separate the connection between the fuse board and the control board, so that, for example in the event of a defect, the replacement of a single functional component is possible, and thus the entire circuit board arrangement does not have to be replaced.

Plug sockets for receiving the plug connector may additionally be provided on the fuse board and/or on the control board. The plug connector inserted into the plug sockets of the fuse board and the control board, can produce an electrical connection between the fuse board and the control board. In addition, a mechanical, in particular form-locking connection between the fuse board and the control board, may be achieved by inserting the plug connector into the plug sockets on the fuse board and the control board.

The circuit board arrangement may be, in particular, part of an energy distribution system, in particular an AXL-X system, and may create in said system an overcurrent protection device for electrical leads with a reduced cross-section, in particular electric stubs. Relevant aspects of the disclosure relate to the implementation of such an electrical circuit with as little expenditure as possible, in particular in terms of space.

Compared to reshaped two-dimensional stamped grids, a three-dimensional planarly nested construction of the circuit board arrangement may be a more cost-effective, more flexible and more maintenance-friendly design of a lead arrangement.

BRIEF DESCRIPTION OF THE DRAWINGS

Further design examples will be explained with reference to the accompanying figures.

BRIEF DESCRIPTION OF THE DRAWINGS

Figure 1:
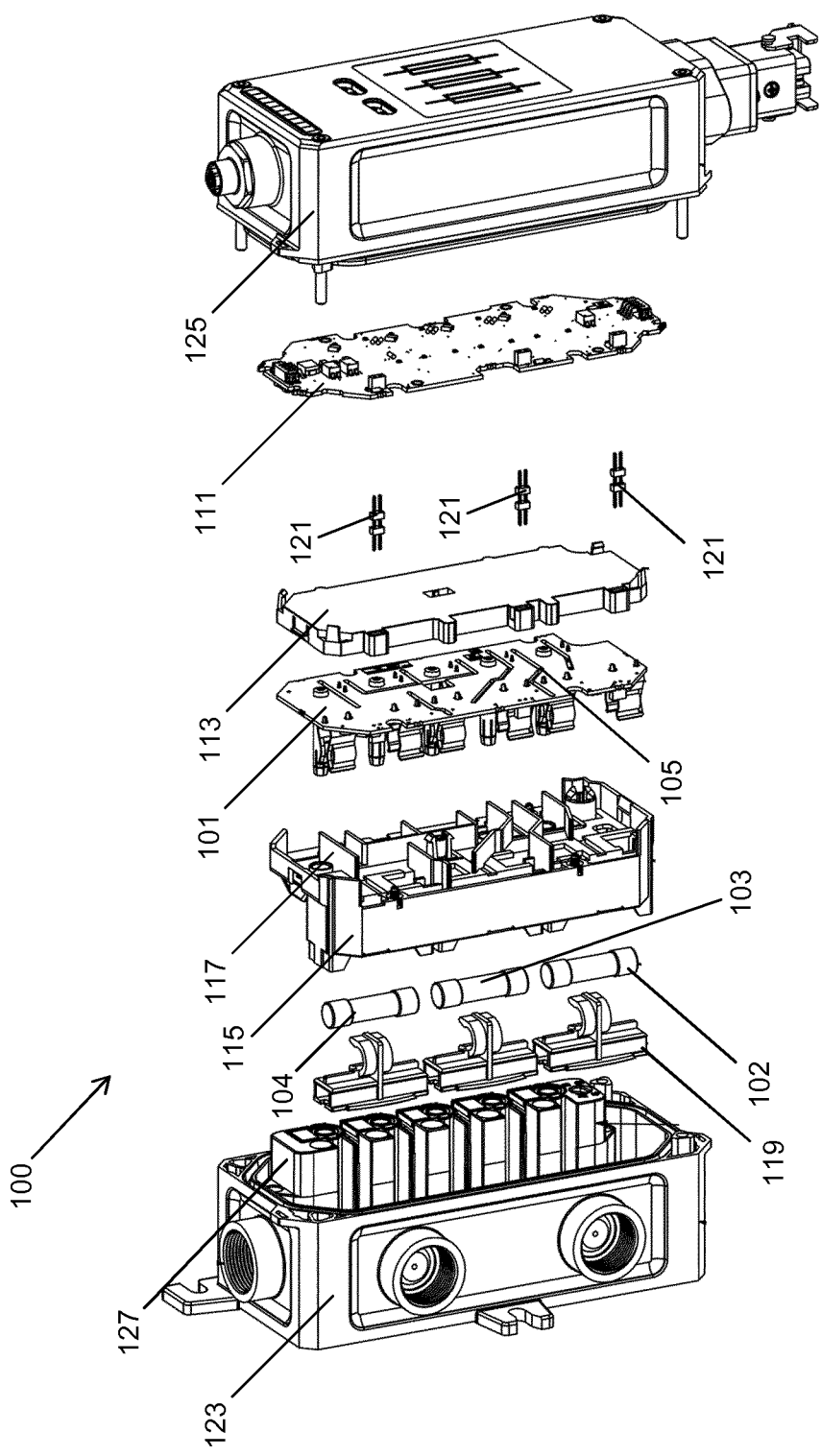
FIG. 1 shows a circuit board arrangement according to one example.

FIG. 1 shows a schematic exploded view of the circuit board arrangement 100 having a fuse board 101 for holding an electrical fuse 103, wherein the fuse board 101 comprises electrical leads and openings 105 formed between adjacent electrical leads; and having an insulating member 115 which is configured to receive the fuse board 101, wherein the insulating member 115 comprises separators 117, wherein the separators 117 may be introduced into the openings 105 to electrically separate the electrical leads.

FIG. 1 further shows three fuses 102, 103 and 104 with the corresponding fuse holders 119, the cover plate 113, the plug connectors 121, the control board 111, the housing upper part 125 and the housing lower part 123 with the terminal block 127. The components of the circuit board arrangement may be mechanically combined in accordance with the orientation and order shown in FIG. 1, in order to effect a fixed mechanical plug connection between the components of the circuit board arrangement 100. The form-locking connections of the electrical contacts are, in particular, configured to be released non-destructively. This relates specifically to the following connections: terminal block 127 with fuse board 101, fuses 102, 103, 104 with fuse board 101, plug connector 121 with fuse board 101 and the plug connector 121 with control board 111.

The housing of the circuit board arrangement 100, which consists of the housing lower part 123 with the contact block 127 and the housing upper part 125, may be part of a series of housing parts which are compatible with one another. The housing and the components of the circuit board arrangement 100 may be, in particular, part of a modular-type system, in which all the components of the system are mechanically and/or electrically compatible with one another. The AXL-X system, in which the housing parts may be selected from the 80/48 mm or 80/96 mm series is, for example, an example of such a system.

Figure 2:
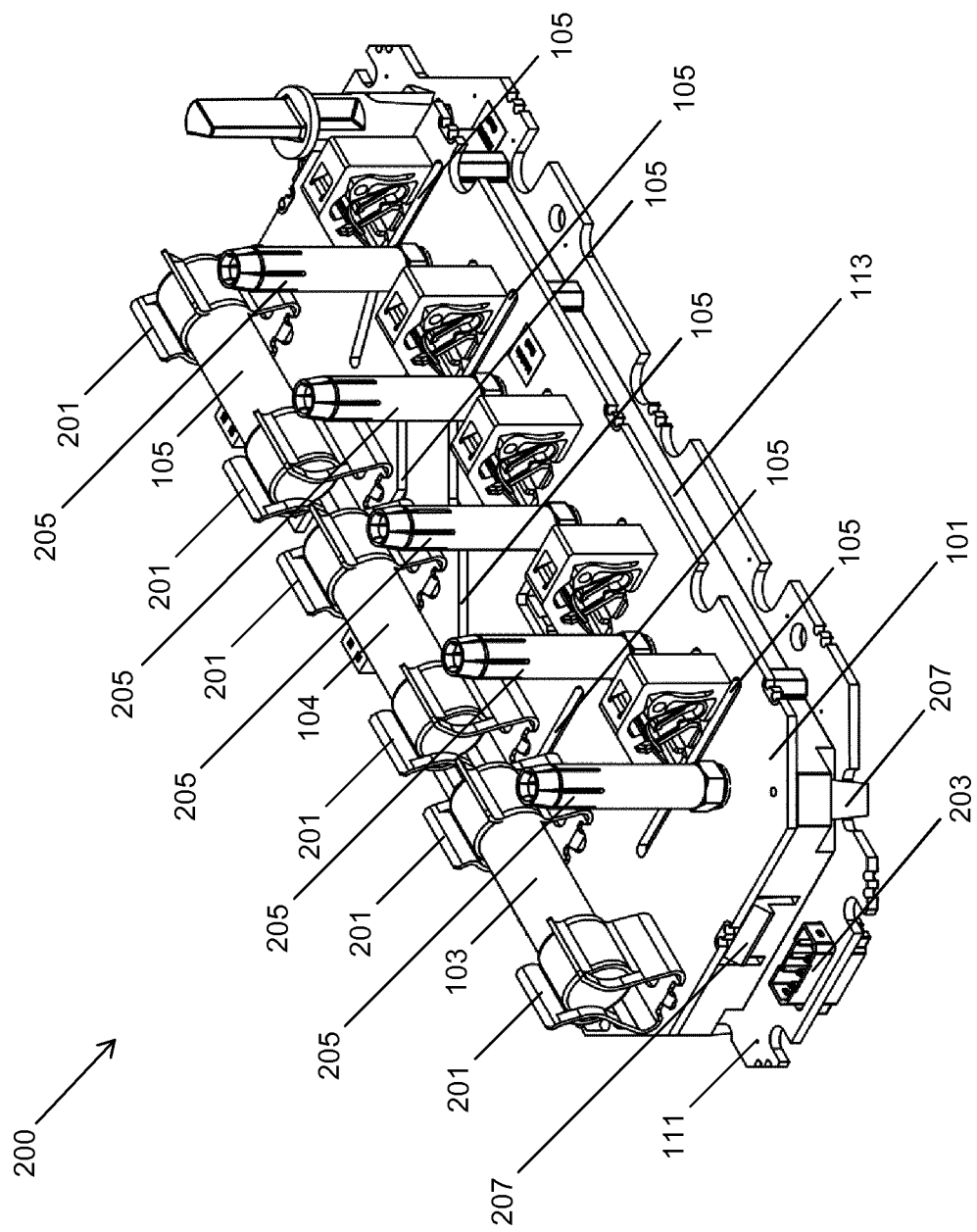
FIG. 2 shows an assembly consisting of a fuse board, a cover plate and a control board.

FIG. 2 shows a partial assembly 200 consisting of a fuse board 101, a cover plate 113 and a control board 111. The fuse board 101 comprises a plurality of fuse receptacles 201, wherein each fuse 102, 103, 104 is mechanically and electrically connected to one pair of fuse receptacles 201. The fuse board 101 further comprises a five-pole plug contact 205, which is configured for the mechanical and electrical connection of the fuse board 101 to the terminal block 127. The openings 105 extend respectively between the plug contacts 205 and extend respectively between the fuse receptacles 205. The openings 105 may be slot-shaped. Two plug sockets 203, which are, in particular, 4-poled, are arranged on the control board 111 as well.

The cover plate 113 may comprise snap-in connectors 207, which are configured to receive the control board 111.

A secure tap reduced in cross-section in an energy supply network may be implemented by connecting electrical leads via the five-poled plug contact 205, which is effected, in particular, by means of 5 push contacts on the fuse board 101. The push contacts may be soldered into the fuse board 101.

The electrical leads connected to the circuit board arrangement 100 may be tucked into a lead channel and covered with a plastic strip.

Figure 3:
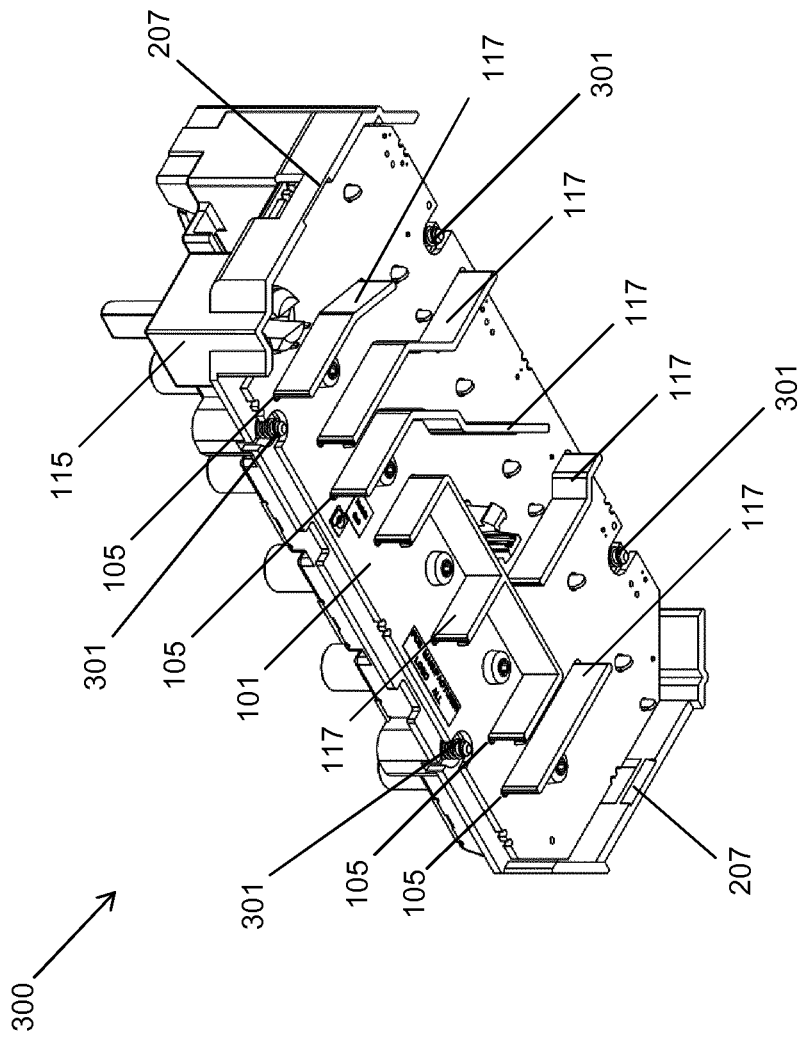
FIG. 3 shows an assembly including an insulating member and a fuse board.

FIG. 3 shows a partial assembly 300 consisting of a fuse board 101 and an insulating member 115. The separators 117 are inserted into the openings 105 and project from the side of the fuse board 101 facing away from the insulating member 115. The separators thus separate the electrical leads and the electrical components on the fuse board 101 on both sides of the fuse board.

In one example, the mechanical connection between the fuse board 101 and the insulating member 115 is effected using screw connections 301 to produce, in particular, a fixed and precise connection.

In one example, the separators 117 have a straight shape or are composed of straight sections which are arranged at angles to one another.

Figure 4:
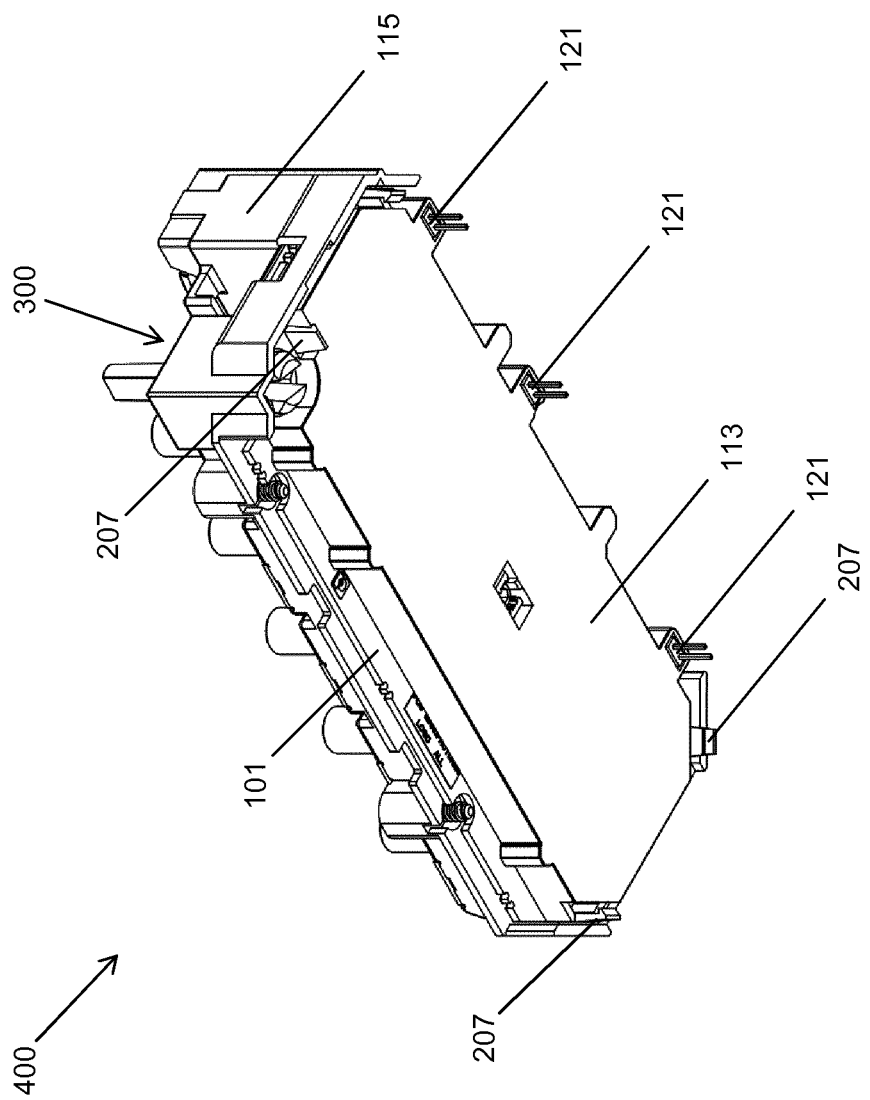
FIG. 4 shows an assembly consisting of an insulating member, a fuse board and a cover plate.

FIG. 4 shows a partial assembly 400 consisting of a fuse board 101, an insulating member 115 and a cover plate 113. Corresponding receptacles for the plug connectors 121 are provided in the cover plate 113, into which the plug connectors 121 are inserted. The plug connectors 121 may be formed by two electrical conductors and two connector pieces which make possible a friction fit in the cover plate 113.

In one example, the insulating member 115 laterally delimits the fuse board 101 and/or the cover plate 113, so that the insulating member 115 at least partially encloses the fuse board 101 and/or the cover plate 113.

In one example, the cover plate 113 comprises a hollow space having a depth which corresponds to at least the height of the sections of the separators 117 that project from the fuse board 101. Placing the cover plate 113 on the partial assembly 300 thus results in the lowest possible additional construction height.

Figure 5:
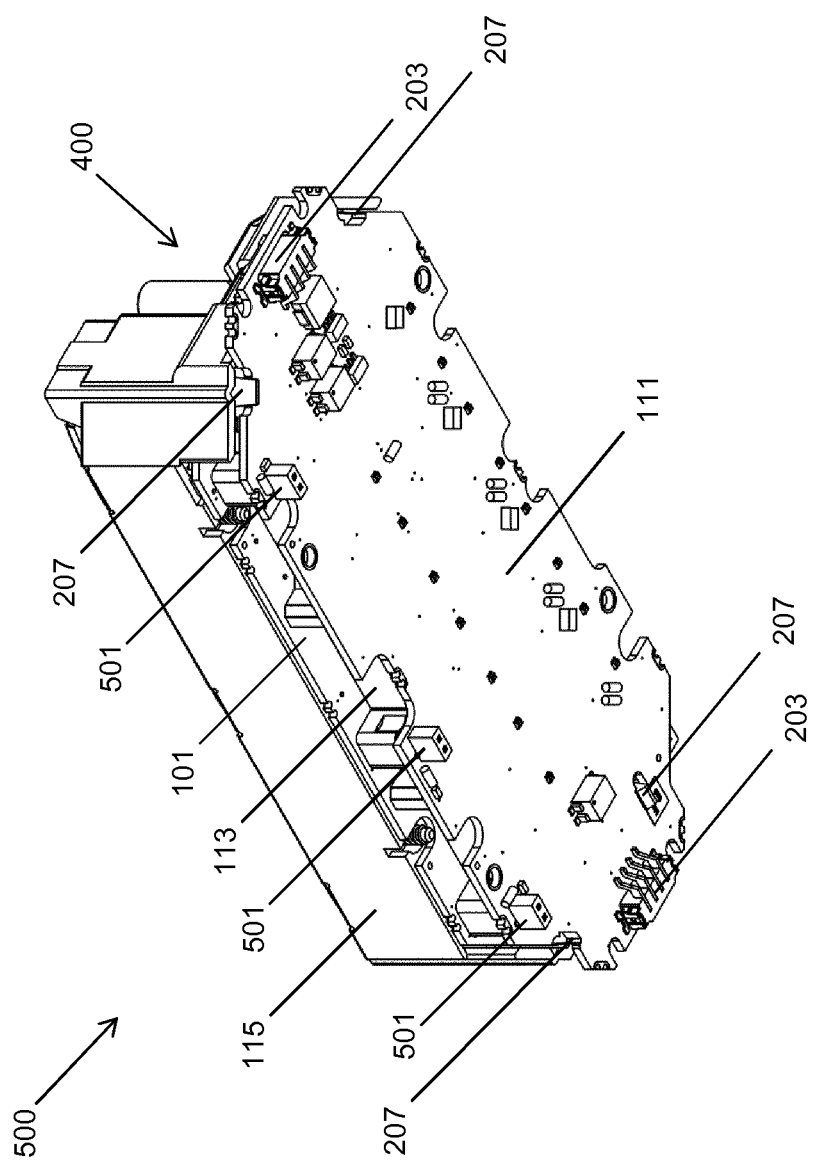
FIG. 5 shows a ircuit board arrangement according to one example.

FIG. 5 shows a partial assembly 500 consisting of a fuse board 101, an insulating member 115, a cover plate 113 and a control board 111. The partial assembly 500 is, in particular, an assembly consisting of a partial assembly 400 corresponding to the example shown in FIG. 4 with the control board 111. Plug sockets 501 for receiving the plug connectors 121 are configured on the control board 111. The plug sockets 501 are arranged on a side facing away from the partial assembly 400. The control board 111 is connected to the partial assembly 400 and, in particular, to the insulating member 115 via snap-in connectors 207. The control board comprises two plug sockets 203, wherein the contacts of the plug sockets 203 are arranged on a side of the control board 111 facing toward the partial assembly 400. One section of the plug sockets 203 additionally projects from the control board 111 on a side of the control board 111 facing away from the partial assembly 400.

The contacts of the interface 203 are, in particular, guided out through the housing upper part 125 or the housing lower part 123 via an M12 socket.

A diagnosis of an electrical circuit formed by the circuit board arrangement 100 may be accomplished via the electrical signal line provided by the M12 socket or via the local LED display. The LED display may be arranged directly on the circuit board 111, on a side of the control board 111 facing toward the housing upper part 125.

Figure 6:
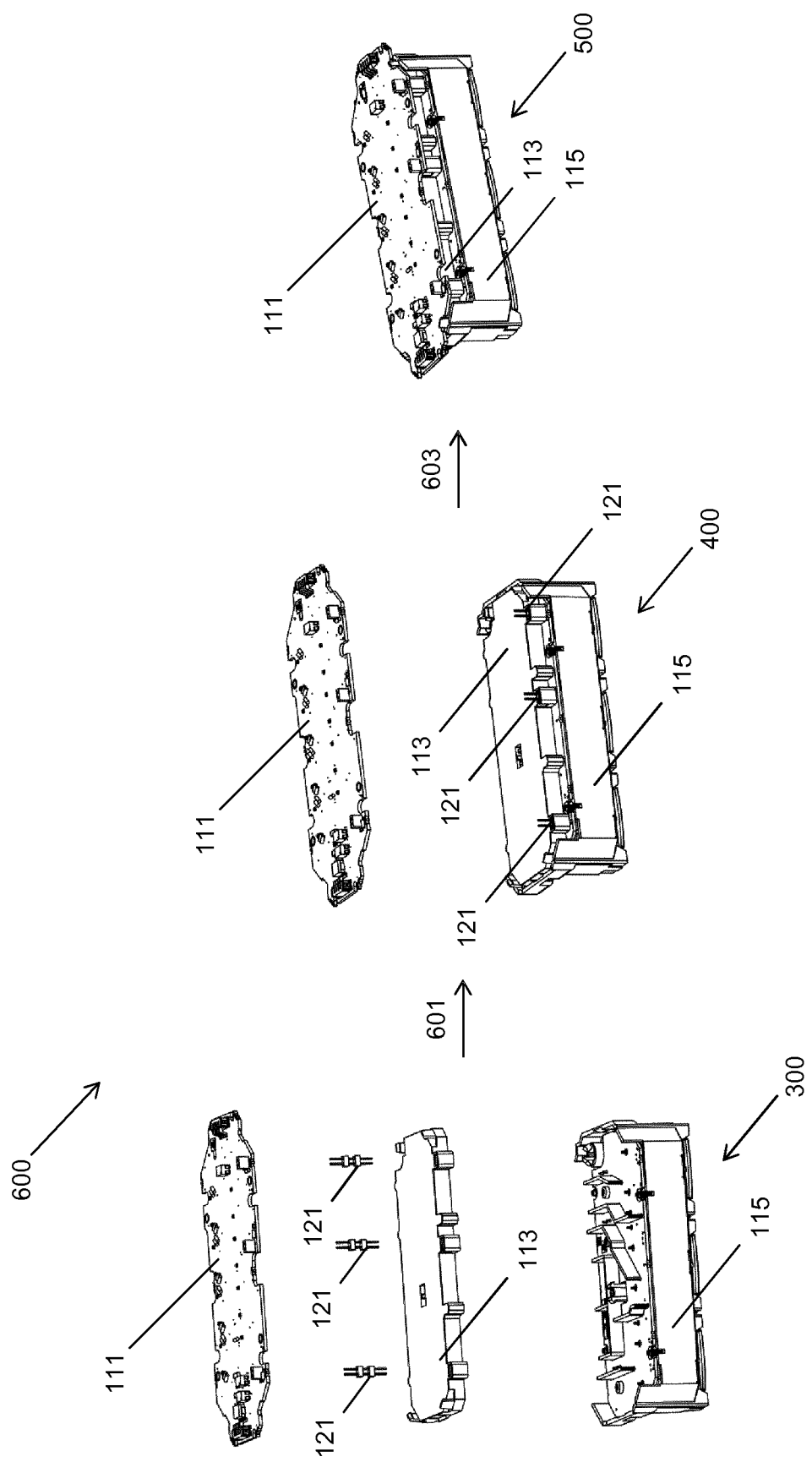
FIG. 6 shows a method for producing a circuit board arrangement.

FIG. 6 shows a method 600 for producing the circuit board arrangement 100 including positioning 601 the cover plate 113 and connecting the plug connectors 121 to the fuse board 101 to form the partial assembly 400, and comprises plugging 603 the control board 111 onto the partial assembly 400, wherein the plug connectors 121 are connected to the control board 111, while at least one electrically-conductive connection is formed between the control board 111 and the fuse board 101, and wherein the partial assembly 400 with the control board 111 forms the partial assembly 500.

The method 600 may additionally be improved by inserting the fuses 102, 103, 104 into the fuse board 101, wherein an electrically-conductive connection is formed between the fuses 102, 103, 104 and the fuse board 101, and by inserting the circuit board 101 into the insulating member 115, wherein the separators 117 electrically separate the electrical leads on the fuse board 101.

The connection of the fuse board 101 to the insulating member 115 and the connection of the cover plate 113 to the fuse board 101 and the connection of the cover plate 113 to the control board 111 may be made by using a screw connection or by a snap-in connection. Said snap-in connection may be made, in particular, by using an elastic click connection with hooks.

Figure 7:
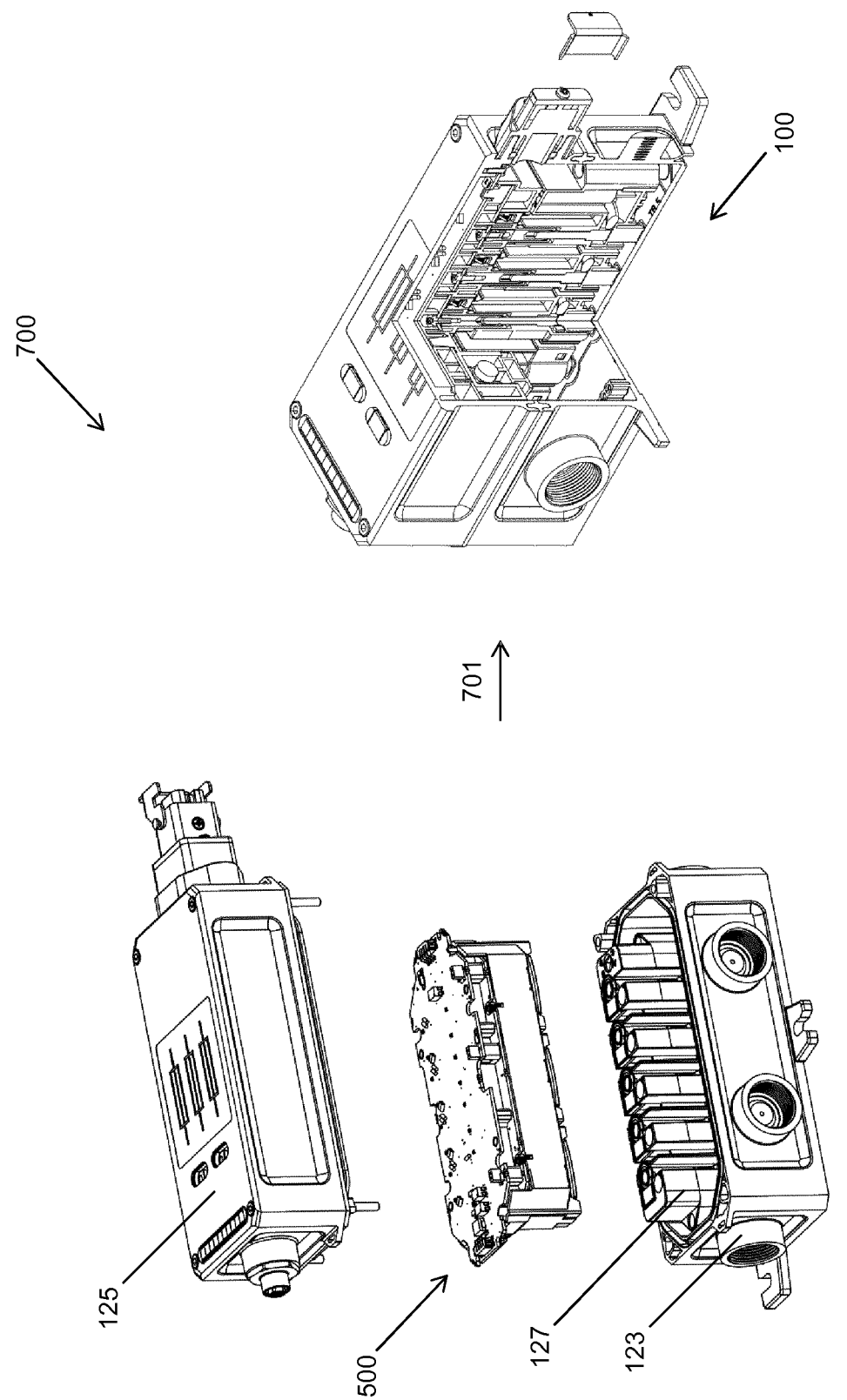
FIG. 7 shows a method for producing a circuit board arrangement.

FIG. 7 shows a method 700 for producing a protected circuit board arrangement 100 comprising the partial assembly 500, the housing lower part 123 with the terminal block 127, and the housing upper part 125. The method 700 includes inserting 701 the partial assembly 500 between the housing upper part 125 and the housing lower part 123, wherein the partial assembly 500 engages in the terminal block 127 in a form-locking manner so as to produce an electrically conductive connection i between the terminal block 127 and the circuit board arrangement 100.

The housing lower part 123 and the housing upper part 125 may be connected to one another in a sealing manner, to protect the circuit board arrangement 100 is against the effect of external influences. A protection of the circuit board arrangement 100 in accordance with a protection class and a protection type may thus be achieved. The housing upper part 123, the housing lower part 125 and the sealing connection between the housing upper part 123 and the housing lower part 125 are configured, in particular, to protect the circuit board arrangement 100 in accordance with the protection type
IP67, so that the circuit board arrangement 100 is sealed against dust and temporary submersion and there is complete protection against contact.

Figure 8:
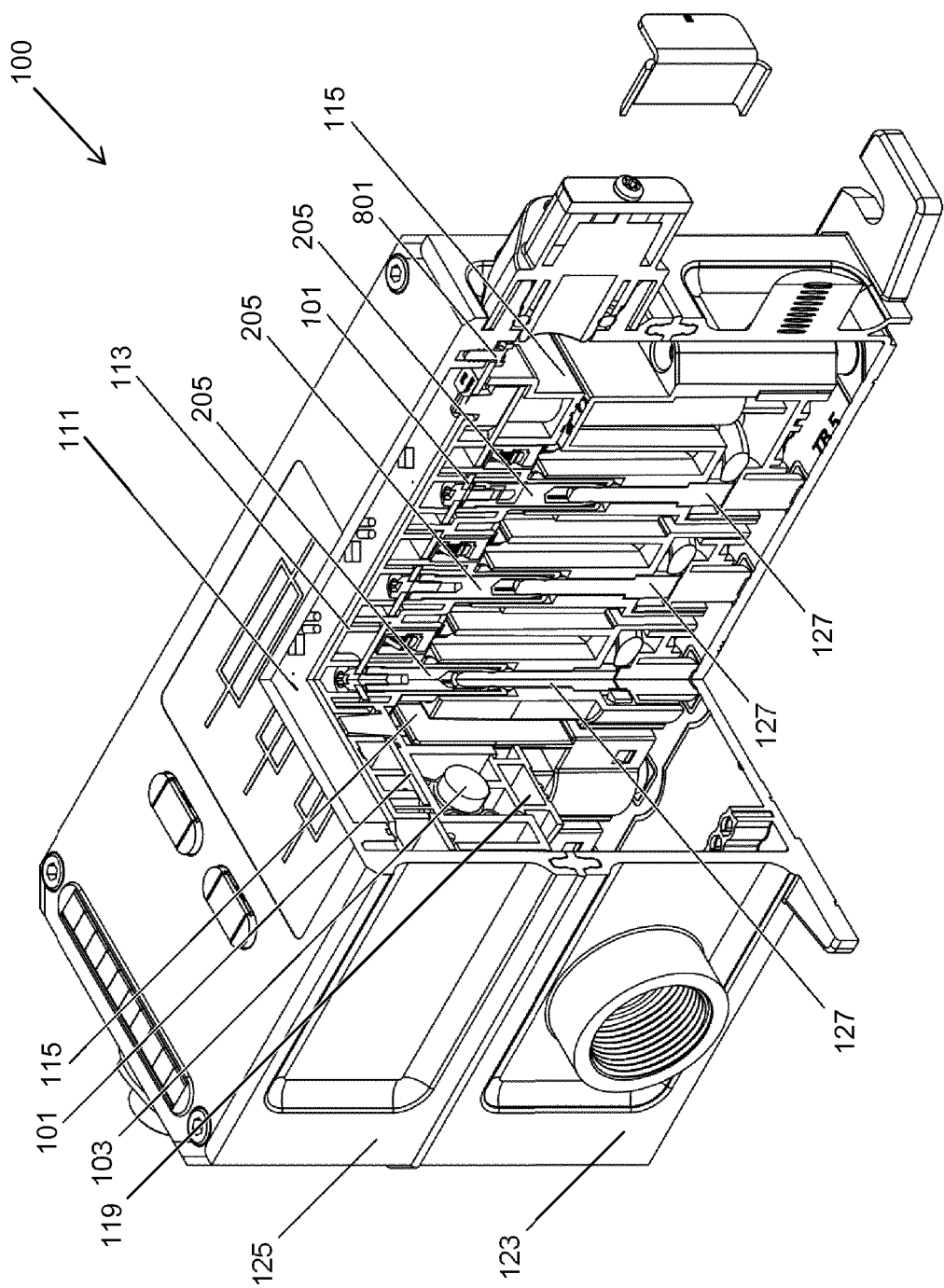
FIG. 8 a protected circuit board arrangement according to one example.

FIG. 8 shows a partial cross-section of the circuit board arrangement 100. In particular, the planarly nested, interlocking connection of the individual functional components and the arrangement of the circuit board arrangement 100 between the housing upper part 123 and the housing lower part 125 are shown. The terminal block 127 is connected to the plug contacts 205 of the fuse board 101 in a form-locking manner. The circuit board arrangement 100 is connected to the housing upper part 123 by means of a screw connection 801.

Figure 9:
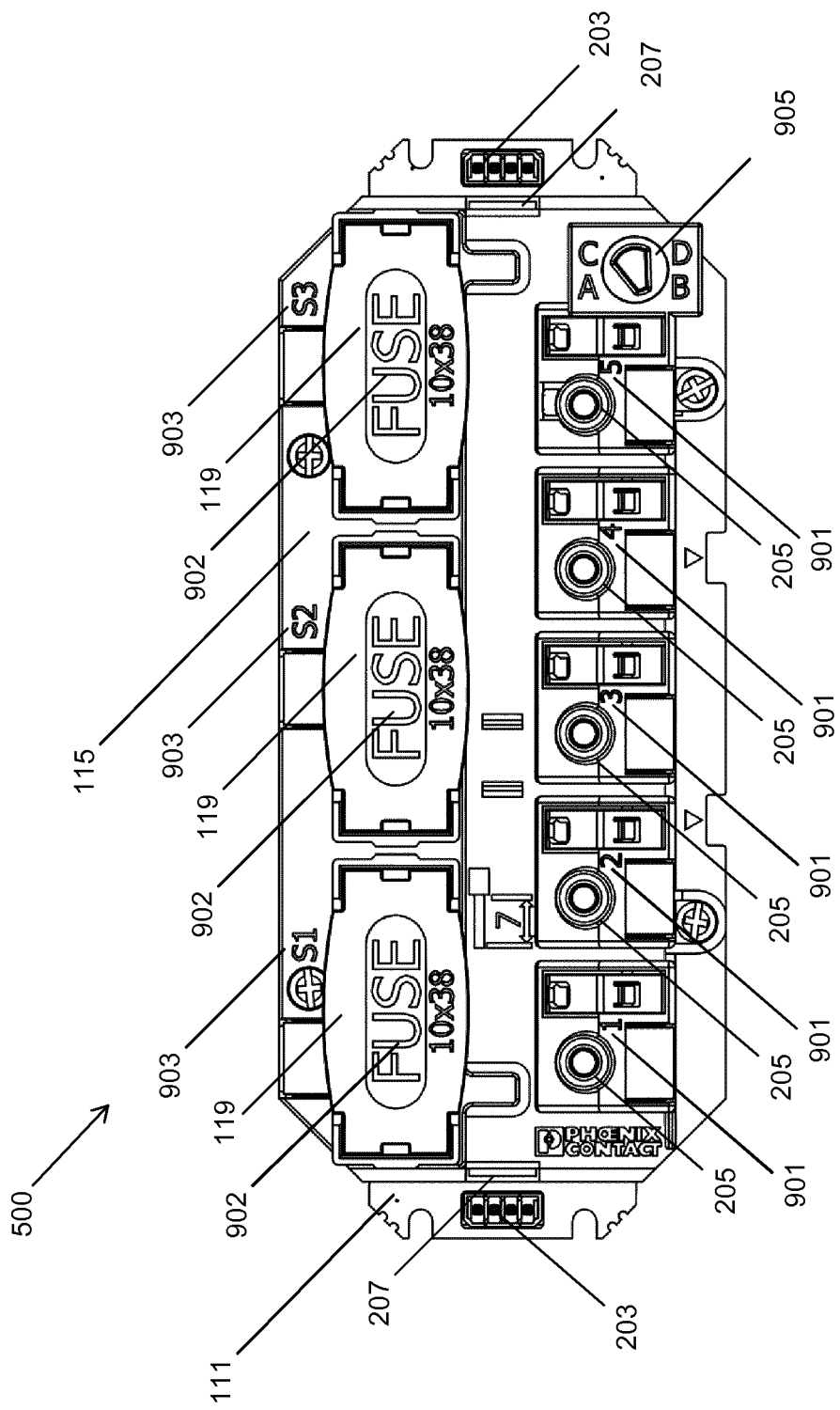
FIG. 9 shows a circuit board arrangement according to one example.

FIG. 9 shows the partial assembly 500 consisting of a fuse board 101, an insulating member 115, a cover plate 113 and a control board 111. The fuses 102, 103, 104 are arranged in the fuse receptacles 201 on the fuse board 101 in accordance with the example shown in FIG. 2. Each of the fuses 102, 103, 104 is additionally connected to a fuse holder 119. Furthermore, the fuse holders 119 are provided with markings 902, which indicate, in particular, the type of the fuses 102, 103, 104. The fuses 102, 103, 104 are also labelled with markings 903. A mode selection switch 905 with four switch positions is also arranged on the fuse board 101. The plug contacts 205 of the fuse board 101 are labelled with numeric markings 901. The markings 901, 903 are attached to the insulating member 115.

The selected switch position of the mode selection switch 905 may determine, for example, the operating mode or other characteristics of the electrical circuit implemented with the circuit board arrangement 100.

The fuse holder 119, which may at least partially circumferentially enclose the fuse 103, facilitates the replacement of the fuse 103. In order to protect the fuse from direct contact, for example by a maintenance worker or a service tool, the fuse holder 119 may be made of an insulating plastic. The likelihood of a malfunction as a result of unintended flowing currents may thus be advantageously reduced.

Furthermore, the fuse holder 119 may be configured to accommodate a lever tool, for example a screwdriver, to make releasing the fuse 103 from the fuse receptacle 201 easier.

The markings 901, 902, 903 permit an identification of the individual fuses 102, 103, 104, plug contacts 205 and/or the type of the fuses 102, 103, 104, when the housing of the circuit board arrangement 100 is open.

Figure 10:
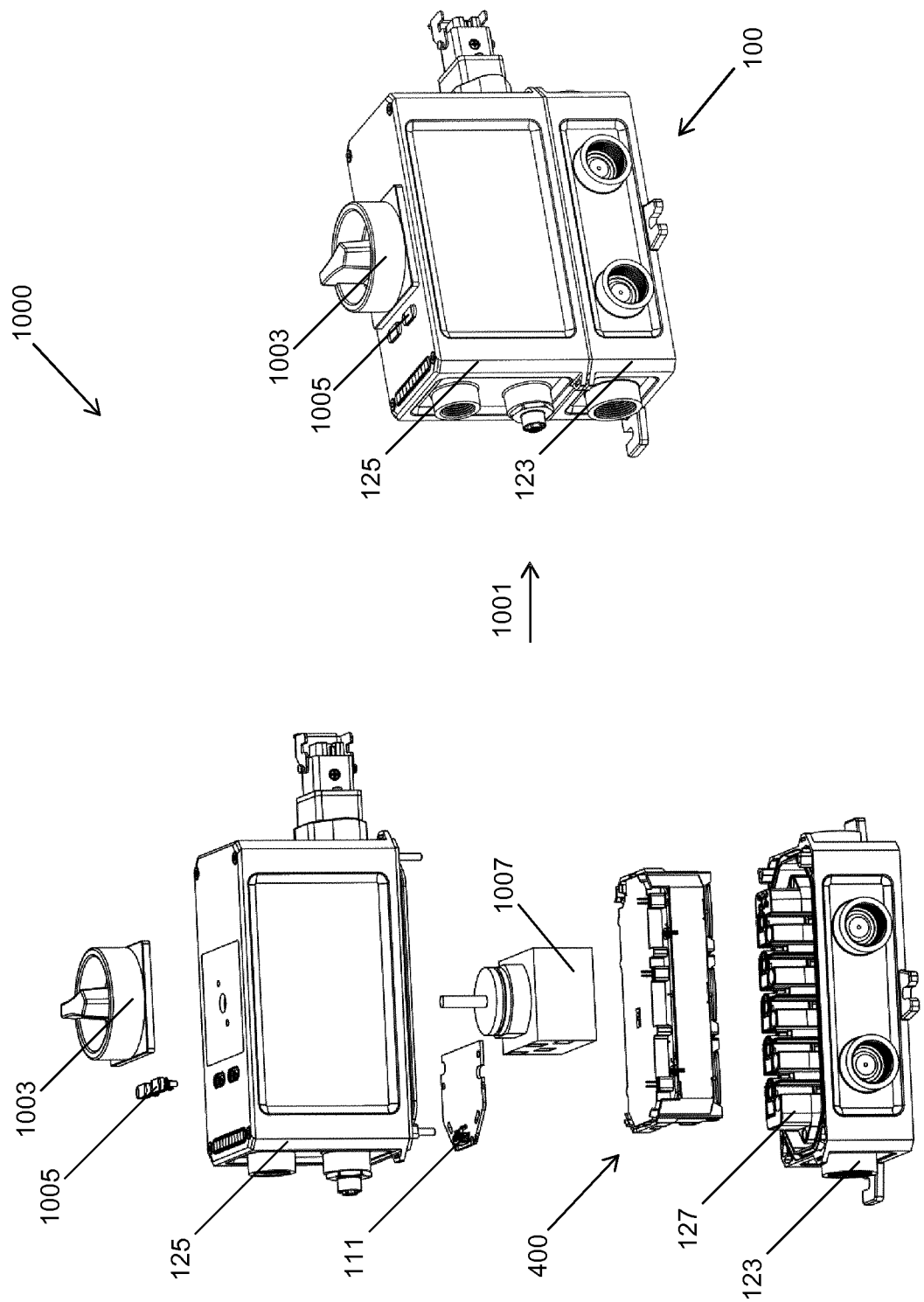
FIG. 10 shows a method for producing a protected circuit board arrangement having a switch.

FIG. 10 shows a method 1000 for producing a protected circuit board arrangement 100 comprising the partial assembly 400, the housing lower part 123 with the terminal block 127, the housing upper part 125, a rotary toggle knob 1003 and a switch 1007. The method 1000 includes inserting 1001 the partial assembly 400 between the housing upper part 125 and the housing lower part 123, wherein the partial assembly 400 engages in the terminal block 127 in a form-locking manner to produce an electrically-conductive connection between the terminal block 127 and the circuit board arrangement 100. Furthermore, the switch 1007 passes through an opening in the housing upper part 125, so that the rotary toggle knob 1003 may be placed on an axis of the switch 1007.

In one example, the control board 111 is shortened, so that the control board 111 may be placed on the cover plate 113 on the side of the switch 1007. The control board 111 may be connected to the housing upper part 125 by means of screw connections.

The housing upper part 125 may comprise an opening to accommodate a viewing window 1005. The viewing window 1005 may be arranged in the opening of the housing upper part 125, so that a display, in particular an LED display, which may be arranged on the control board 111, may be seen through the viewing window 1005.

The housing of the circuit board arrangement 100 protects the circuit board arrangement 100 from the effect of external influences. Appropriate protection classes and protection types are defined for industrial applications, wherein the housing complies with protection type IP67, for example, so that the circuit board arrangement 100 in the housing is sealed against dust and temporary submersion and there is complete protection against contact.

Automatic separation of the current-carrying leads may be implemented when the housing is opened in order to simplify the maintenance of the circuit board arrangement 100. The housing may be opened by separating the bottom of the housing 123 from the top of the housing 125. In the present disclosure, the automatic separation of the current-carrying leads when the housing is opened is effected by the plug contacts 205 on the fuse board 101 and the terminal block 127 in the bottom of the housing 123. The circuit board arrangement 100 is connected to the top of the housing 125, so that the mechanical and electrical connection between the plug contacts 205 of the fuse board 101 and the terminal block 127 is disconnected when the housing is opened, and no current flows through the electrical components or electrical leads that are accessible upon opening. The plug contacts 205 and the terminal block 127 may comprise sheathed or recessed contacts, so that even contacts to which a voltage is applied when the housing is in the open state are protected against contact when the housing is open.

LIST OF REFERENCE SIGNS

100 Circuit board arrangement
101 Fuse board
102 Fuse
103 Fuse
104 Fuse
105 Opening
111 Control board
113 Cover plate
115 Insulating member
117 Separators
119 Fuse holder
121 Plug connector
123 Housing lower part
125 Housing upper part
127 Terminal block 200 Partial assembly
201 Fuse receptacle
203 Plug socket
205 Plug contact
207 Snap-in connector
300 Partial assembly
301 Screw connection
400 Partial assembly
500 Partial assembly
501 Plug socket
600 Method
601 Placing
603 Plugging
700 Method
701 Inserting
801 Screw connection
901 Marking
902 Marking
903 Marking
905 Mode selection switch
1000 Method
1001 Assembling
1003 Rotary toggle knob
1005 Viewing window
1007 Switch

What is claimed is:

1. A circuit board arrangement comprising:
a fuse board configured to hold an electrical fuse, wherein the fuse board comprises electrical leads and openings formed between adjacent electrical leads; and
an insulating member configured to receive the fuse board wherein the insulating member comprises separators and wherein the separators are configured to insert into the openings and electrically separate the electrical leads.

2. The circuit board arrangement according to claim 1, wherein the fuse board is configured to insert and lock into the insulating member, and wherein the insulating member at least partially laterally surrounds the fuse board.

3. The circuit board arrangement according to claim 1, wherein the separators pass through the openings in the fuse board and protrude from a side of the fuse board facing away from the insulating member to electrically insulate electrical leads from one another on the side of the fuse board facing away from the insulating member.

4. The circuit board arrangement according to claim 1, wherein the separators have a straight shape.

5. The circuit board arrangement according to claim 1, wherein the fuse board comprises a plurality of plug contacts wherein the insulating member circumferentially encloses the plug contacts.

6. The circuit board arrangement according to claim 1, further comprising a fuse receptacle arranged on the fuse board and configured to hold the fuse.

7. The circuit board arrangement according to claim 6, wherein the separators respectively electrically insulate a plurality of plug contacts and the fuse receptacle from one another.

8. The circuit board arrangement according to claim 7, wherein the plug contacts and the fuse receptacle are arranged on a side of the fuse board facing toward the insulating member and are laterally delimited by the insulating member.

9. The circuit board arrangement according to claim 6, further comprising:
receiving sleeves for screw connections laterally configured in the insulating member; and
notches for the screw connections formed in the fuse board;
wherein the circuit board arrangement with the insulating member and the fuse receptacle is configured to be be mounted facing outward in a housing upper part via the screw connections.

10. The circuit board arrangement according to claim 9, wherein the fuse and a further fuse are arranged on the fuse board in the fuse receptacle wherein the insulating member laterally encloses and electrically insulates the fuse and the further fuse.

11. The circuit board arrangement according to claim 1, wherein the fuse passes through an opening in the insulating member.

12. The circuit board arrangement according to claim 1, further comprising:
a control board and a plug connector; wherein the plug connector is configured to mechanically and electrically connect the fuse board with the control board.

13. The circuit board arrangement according to claim 1, further comprising:
a cover plate, wherein a plurality of snap-in connectors configured to receive the cover plate are formed in the insulating member, wherein the cover plate is arranged on a side of the fuse board facing away from the insulating member.

14. The circuit board arrangement according to claim 13, further comprising:
a fuse receptacle arranged on the fuse board and configured to hold the fuse; and
a control board and a plug connector, wherein the plug connector is configured to mechanically and electrically connect the fuse board with the control board;
wherein the circuit board arrangement is configured to be mounted facing outward in a housing upper part;
wherein the housing upper part, the control board, the cover plate, the fuse board, and the insulating member are configured to stack one inside the other.

15. The circuit board arrangement according to claim 13, wherein the cover plate comprises openings configured to receive the plug connector.

16. The circuit board arrangement according to claim 1, wherein the insulating member is configured to attach and lock onto the fuse board, and wherein the insulating member at least partially laterally surrounds the fuse board.

17. The circuit board arrangement according to claim 1, wherein the separators are composed of a plurality of straight sections arranged at angles to one another.

* * * * *